United States Patent
Han

(10) Patent No.: US 8,024,630 B2
(45) Date of Patent: Sep. 20, 2011

(54) DEBUGGING MODULE FOR ELECTRONIC DEVICE AND METHOD THEREOF

(75) Inventor: Jia-Qing Han, Shenzhen (CN)

(73) Assignees: Shenzhen Futaihong Precision Industry Co., Ltd., ShenZhen, Guandong Province (CN); Chi Mei Communication Systems, Inc., Tu-Cheng, New Taipei (TW)

( * ) Notice: Subject to any disclaimer, the term of this patent is extended or adjusted under 35 U.S.C. 154(b) by 33 days.

(21) Appl. No.: 12/578,168

(22) Filed: Oct. 13, 2009

(65) Prior Publication Data

US 2010/0299566 A1 Nov. 25, 2010

(30) Foreign Application Priority Data

May 23, 2009 (CN) .......................... 2009 10 302551

(51) Int. Cl.
*G01R 31/28* (2006.01)
(52) U.S. Cl. ..................................................... 714/727
(58) Field of Classification Search .................. None
See application file for complete search history.

(56) References Cited

U.S. PATENT DOCUMENTS

2008/0120058 A1* 5/2008 Kim ............................. 702/118
2010/0272097 A1* 10/2010 So et al. ........................ 370/352

OTHER PUBLICATIONS

Patel, J.N.; Abid, Z.; Design of PC-programmable digital hearing-testing, 2005, device, Digital Object Identifier, 10.1109/CCECE.2005.1556919 pp. 244-247.*

* cited by examiner

*Primary Examiner* — Jeffrey A Gaffin
*Assistant Examiner* — Guerrier Merant
(74) *Attorney, Agent, or Firm* — Altis Law Group, Inc.

(57) ABSTRACT

A debugging module for connecting an IC to a JTAG debugger device includes a JTAG interface, an earphone circuit, a USB interface, a switching unit, and a reset circuit. The earphone circuit is electrically connected to the JTAG interface via the switching unit. The USB interface and the reset circuit are electrically connected to the JTAG interface. When a JTAG debugger device is connected to the earphone circuit and the USB interface, the earphone circuit and the USB interface, respectively, can establish a connection between the JTAG debugger device and the JTAG interface.

6 Claims, 2 Drawing Sheets

DEBUGGING MODULE FOR ELECTRONIC DEVICE AND METHOD THEREOF

BACKGROUND

1. Technical Field

The disclosure generally relates to debugging modules for electronic device, particularly to a Joint Test Action Group (JTAG) interface debugging module and method thereof for electronic devices.

2. Description of Related Art

The use of various functional component (blocks) and component libraries to create a complex integrated circuit (IC) in portable electronic devices is becoming increasingly common. These complex ICs are difficult to test. Traditionally, these ICs incorporate a JTAG interface as a mechanism for emulating and debugging an IC during testing. The JTAG interface is used to download debugging or other testing software from an external device, e.g., a JTAG debugger device, to the functional blocks located on the IC during testing. This standard has been adopted by the Institute of Electrical and Electronics Engineers and is now defined as IEEE Standard 1149.1. During testing, pins of the JTAG interface electrically connect with the JTAG debugger device via welding a wire from the JTAG interface to the JTAG debugger device.

Therefore, there is room for improvement within the art.

BRIEF DESCRIPTION OF THE DRAWINGS

Many aspects of the debugging module and method thereof can be better understood with reference to the following drawing. The components in the drawings are not necessarily drawn to scale, the emphasis instead being placed upon clearly illustrating the principles of the debugging module and method thereof.

DETAILED DESCRIPTION

Figure 1:
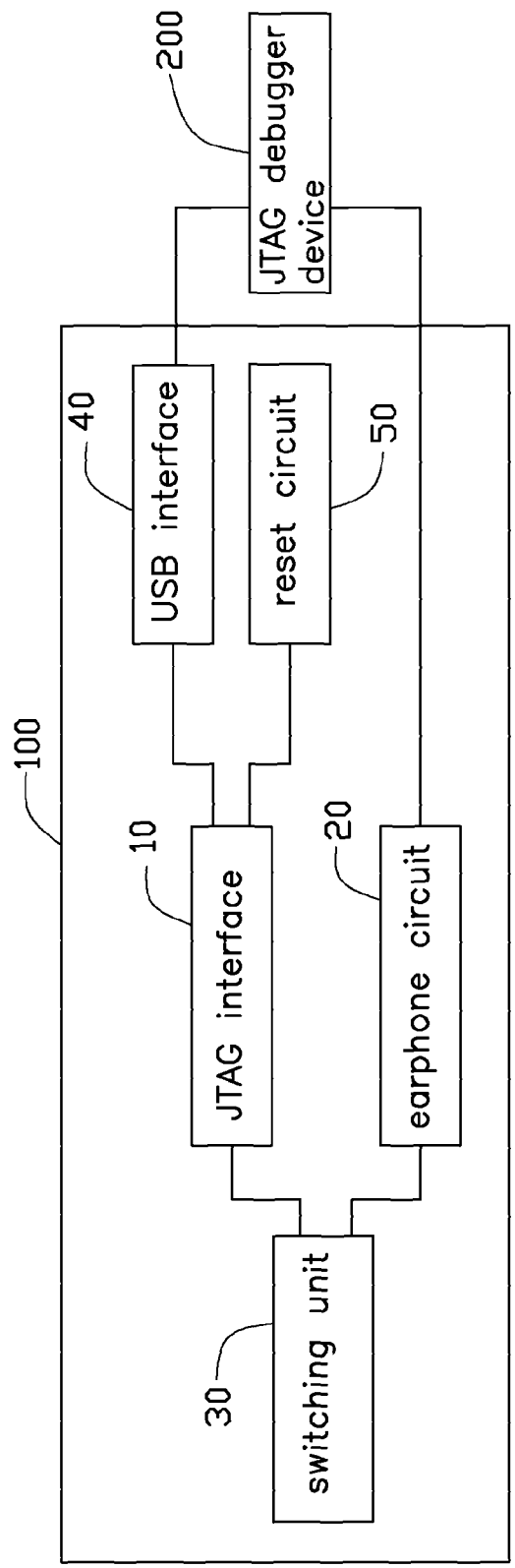
FIG. 1 is a block diagram of a debugging module used to connect a JTAG debugger device, according to an exemplary embodiment.
Figure 2:
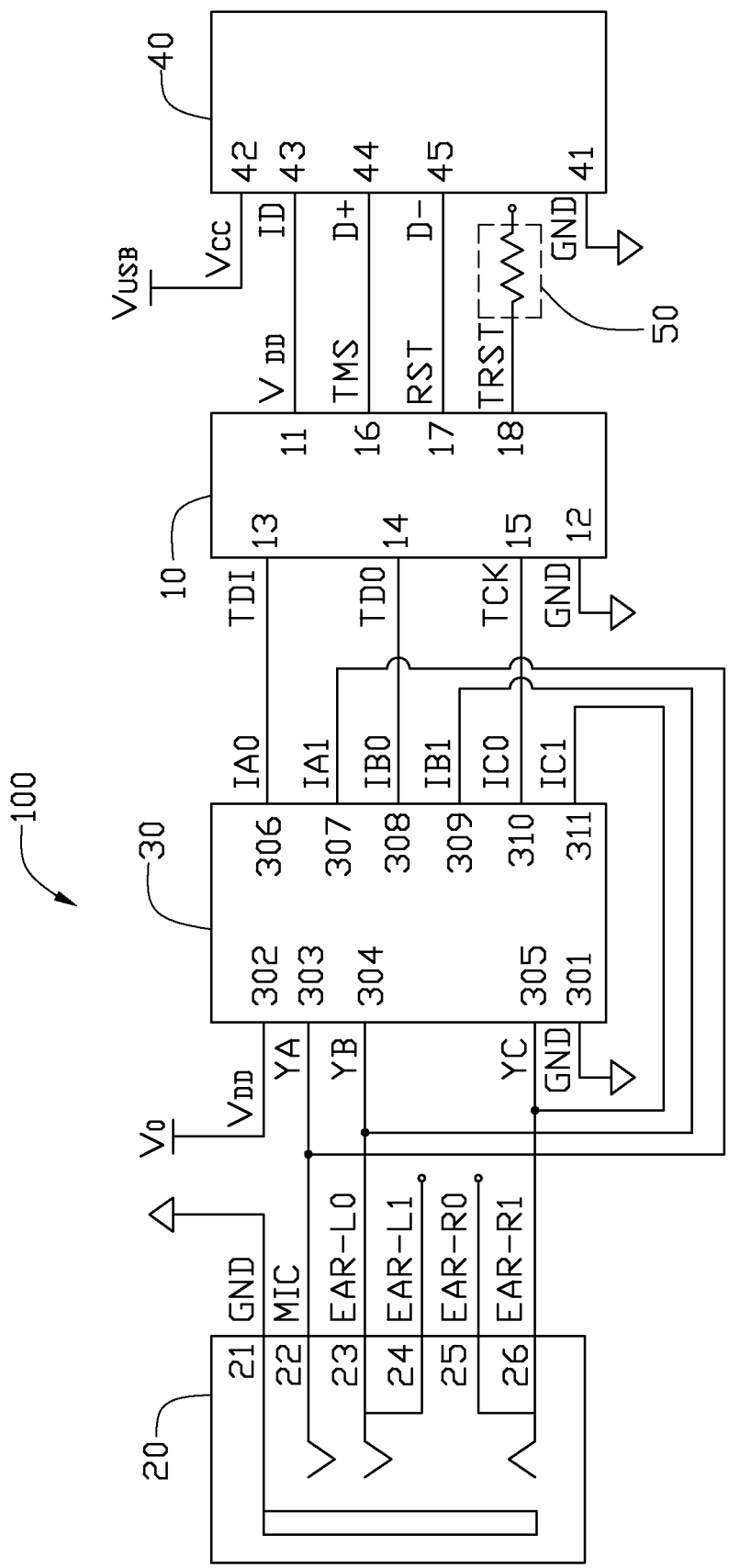
FIG. 2 is a circuit diagram of the debugging module shown in FIG. 1.

Referring to FIGS. 1-2, a debugging module 100 includes a JTAG interface 10, an earphone circuit 20, a switching unit 30, a USB interface 40, and a reset circuit 50. The earphone circuit 20 is electrically connected to the JTAG interface 10 via the switching unit 30. The USB interface 40 and the reset circuit 50 are electrically connected to the JTAG interface 10.

The JTAG interface 10 includes eight pins. The eight pins are contacts on an IC of a portable electronic device for connecting the portable electronic device to a JTAG debugger device 200. The eight pins are VDD pin 11, grounding (GND) pin 12, test data input (TDI) pin 13, test data output (TDO) pin 14, test clock input (TCK) pin 15, test mode selection input (TMS) pin 16, a first test reset input (RST) pin 17 and a second test reset input (TRST) pin 18. The GND pin 12 is electrically connected to ground. The TDI pin 13, TDO pin 14, and TCK pin 15 are electrically connected to the switching unit 30. The VDD pin 11, TMS pin 16, and the RST pin 17 are electrically connected to the USB interface 40. The TDI pin 13, TDO pin 14, TCK pin 15, VDD pin 11, TMS pin 16, and the RST pin 17 can be all connected to the JTAG debugger device 200 via the earphone circuit 20 and the USB interface 40. The TRST pin 18 is electrically connected to the reset circuit 50.

The earphone circuit 20 include a grounding (GND) pin 21, an audio input (MIC) pin 22, two left audio output (EAR_L0, EAR_L1) pins 23, 24, two right audio output (EAR_R0, EAR_R1) pins 25, 26. The GND pin 21 is electrically connected to ground. The MIC pin 22, EAR_L0 pin 23, EAR_L1 pin 24, the EAR_R0 25, and the EAR_R1 26 are electrically connected to audio wires of the portable electronic device to input or output audio signals. The MIC pin 22, the EAR-L0 pin 23, and the EAR_R1 pin 26 are electrically connected to the switching unit 30. The earphone circuit 20 includes an earphone jack (not shown) set on the portable electronic device for connecting a JTAG debugger device 200.

The switching unit 30 includes a grounding (GND) pin 301, a power ($V_{DD}$) pin 302, three input (YA, YB, YC) pins 303~305, and six output (IA0, IA1, IB0, IB1, IC0, IC1) pins 306~311. The GND pin 301 is electrically connected to ground. The $V_{DD}$ pin 302 is electrically connected to a power $V_O$. The YA pin 303, YB pin 304, and the YC pin 305 forms a first pin group correspondingly connected to the MIC pin 22, the EAR_L0 pin 23, and the EAR_R1 pin 26 of the earphone circuit 20. The IA0 pin 306, IB0 pin 308, IC0 pin 310 form a second pin group correspondingly connected to the TDI pin 13, TDO pin 14, and the TCK pin 15 of the JTAG interface 10. The IA1 pin 307, IB1 pin 309, and IC1 pin 311 form a third pin group correspondingly connected to the MIC pin 22, EAR_L0 pin 23 and the EAR_R1 pin 26 of the earphone circuit 20. The second pin group connects to the third pin group when the first pin group detects a JTAG debugger device 200 is electrically connected to the earphone circuit 20. The earphone circuit 20 establishes a connection between the JTAG interface 10 and the JTAG debugger device 200.

The USB interface 40 is a mini USB interface including a GND pin 41, a $V_{CC}$ pin 42, an ID pin 43, a D+ pin 44, and a D− pin 45. The GND pin 41 is electrically connected to ground. The $V_{CC}$ pin 42 is electrically connected to a power $V_{USB}$ for inputting power. The ID pin 43 is for identifying. The D+ pin 44 and the D− pin 45 are for transmitting data. The ID pin 43, the D+ pin 44, and the D− pin 45 are respectively connected to the $V_{DD}$ pin 11, TMS pin 16 and the RST pin 17.

The reset circuit 50 is formed by a resistance with zero ohm. One end of the resistance is electrically connected to the TRST pin 18. Another end of the resistance is electrically connected to an IC of the portable electronic device to receive an initial signal.

During test, the earphone circuit 30 and the USB interface 40 establish a connection between the JTAG debugger device 200 and the JTAG interface 10. Therefore, testers can conveniently and safely operate an emulation of an IC by connecting a plug of a common JTAG debugger device 200 to the jack of the earphone circuit 20 and USB interface 40 without welding any pins of the JTAG interface 10.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A debugging module for connecting an IC to a JTAG debugger device, comprising:
   a JTAG interface;
   a switching unit;
   an earphone circuit electrically connected to the JTAG interface via the switching unit;
   a USB interface electrically connected to the JTAG interface; and a reset circuit electrically connected to the JTAG interface;
wherein the earphone circuit and the USB interface establish a connection between the JTAG debugger device and the JTAG interface when a JTAG debugger device is connected to the earphone circuit and the USB interface, the JTAG interface includes a VDD pin, a TDI pin, a TDO pin, a TCK pin, a TMS pin, a RST pin and a TRST pin, the GND pin is electrically connected to ground, the TDI pin, TDO pin, and TCK pin are electrically connected to the earphone circuit via the switching unit, the VDD pin, TMS pin, and the RST pin are electrically connected to the USB interface, the TRST pin is electrically connected to the reset circuit.

2. The debugging module as claimed in claim 1, wherein the earphone circuit includes a GND pin, a MIC pin, two left audio output pins, and two right audio output pins, the GND pin is electrically connected to ground, the MIC pin, one left audio output pin, one right audio output pin are electrically connected to the switching unit.

3. The debugging module as claimed in claim 1, wherein the USB interface includes a VCC pin, a GND pin, a ID pin, a D− pin, and a D+ pin, the VCC pin is electrically connected to a power, a GND pin is electrically connected to ground, the ID pin, the D− pin and the D+ pin are electrically connected to the VDD pin, the TRST pin, the TMS pin of the JTAG interface.

4. The debugging module as claimed in claim 1, wherein the reset circuit is formed by a resistance connected to the TRST pin with zero ohm.

5. The debugging module as claimed in claim 1, wherein the switching unit includes a GND pin, a VDD pin, a first pin group, a second pin group, and a third pin group, a GND pin is electrically connected to ground, the VDD pin is electrically connected to a power, the first pin group is electrically connected to the earphone circuit, the second pin group is electrically connected to the JTAG interface, the second pin group connects to the third pin group when the first pin group detects a JTAG debugger device is electrically connected to the earphone circuit.

6. The debugging module as claimed in claim 1, wherein the first pin group, the second pin group, the third pin group respectively includes three input/output pins.

* * * * *